Oct. 25, 1966

N. R. CRAIN 3,281,704

REGENERATIVE AMPLIFIER

Filed March 18, 1963

INVENTOR.
NORMAN R. CRAIN
BY
Warren F. B. Lindsley

United States Patent Office 3,281,704

Patented Oct. 25, 1966

3,281,704

REGENERATIVE AMPLIFIER

Norman R. Crain, Phoenix, Ariz., assignor to General Electric Company, a corporation of New York Filed Mar. 18, 1963, Ser. No. 265,757

2 Claims. (Cl. 330—26)

This invention relates to signal amplification and more particularly to transformer coupled regenerative amplifiers effective in one voltage level changing direction only.

Pulse amplifiers have many applications in fields which employ digital techniques such as radar, telemetering and digital computing. In high speed digital computing systems, for example, it is desirable that signals applied to logic gates be brought up to their maximum voltage values or levels as rapidly as possible and then be retained at that level as long as it is desirable which may be merely a matter of microseconds or as long as several or more hours. Since these logic gates may occur at the end of one or more coaxial cables, a signal from a signal source such as a flip-flop may be too weak to bring the coaxial cable line voltage up to its required voltage level fast enough.

Amplifiers have been used to amplify the signals from weak pulse sources such as flip-flops used in the digital computer systems, however, those known amplifier structures including transformer coupled regenerative amplifiers have remained electrically associated with the logic gates after amplification of a pulse and thereby have contributed toward signal degradation through leakage flow of the charge back through the amplifier to a lower potential source.

Thus, an amplifying system is needed which will rapidly amplify a weak voltage pulse to a given voltage level and immediately thereafter remove itself from the load circuit.

In known regenerative pulse amplifier circuits, part of the energy from the output terminal of the amplifier is returned to its input terminal in such a manner that it is only necessary for the input signal to initiate the pulse amplification process and the feedback means supplies the major portion of the required input energy. It has been found with many of the regenerative pulse amplifiers, particularly of the transformer coupled type, that the feedback energy is often large and feedback windings are needed on the transformer to limit the feedback energy. Accordingly, it is another feature of this invention to provide a new and improved regenerative transformer coupled amplifier circuit arrangement in which the feedback energy providing the regenerative effect is effective without feedback limiting windings during only a part of one half of a voltage cycle.

It is therefore one object of the present invention to provide a new and improved signal amplifier.

Another object of this invention is to provide a new and improved signal amplifier which can rapidly change a voltage level across an impedance.

A further object of this invention is to provide a new and improved regenerative pulse amplifier in which the regenerative effect is effective during only one half or less of a voltage cycle.

A still further object of this invention is to provide a new and improved regenerative pulse amplifier in which the amplifier is electrically disconnected from the load after amplification of a pulse.

Other objects and advantages of this invention will become apparent from the following description when taken in connection with the accompanying drawing.

In accordance with the invention claimed, a new and improved unidirectional level changing regenerative transformer coupled amplifier is provided. This amplifier employs a primary winding of the transformer as an input means for receiving pulse signals to be amplified and a transistor as an amplifying means responsive to the pulse signals transmitted by the secondary winding of the transformer. An output terminal of the transistor is arranged to provide a feedback voltage through an R-C impedance to the primary winding of the transformer in phase with the change in voltage on the current control electrode of the transistor to provide regeneration. The primary winding of the transformer is effective in causing regeneration during that time that the voltage is rising at the output terminal of the transistor which is at least a part of one half of the voltage cycle. During the other part of the voltage cycle the transistor is rendered non-conducting and is isolated from the input circuit because the transformer output voltage applied between the control and output electrodes of the transistor drops below a given value needed to maintain the transistor conductive.

Figures 1, 2, 3:
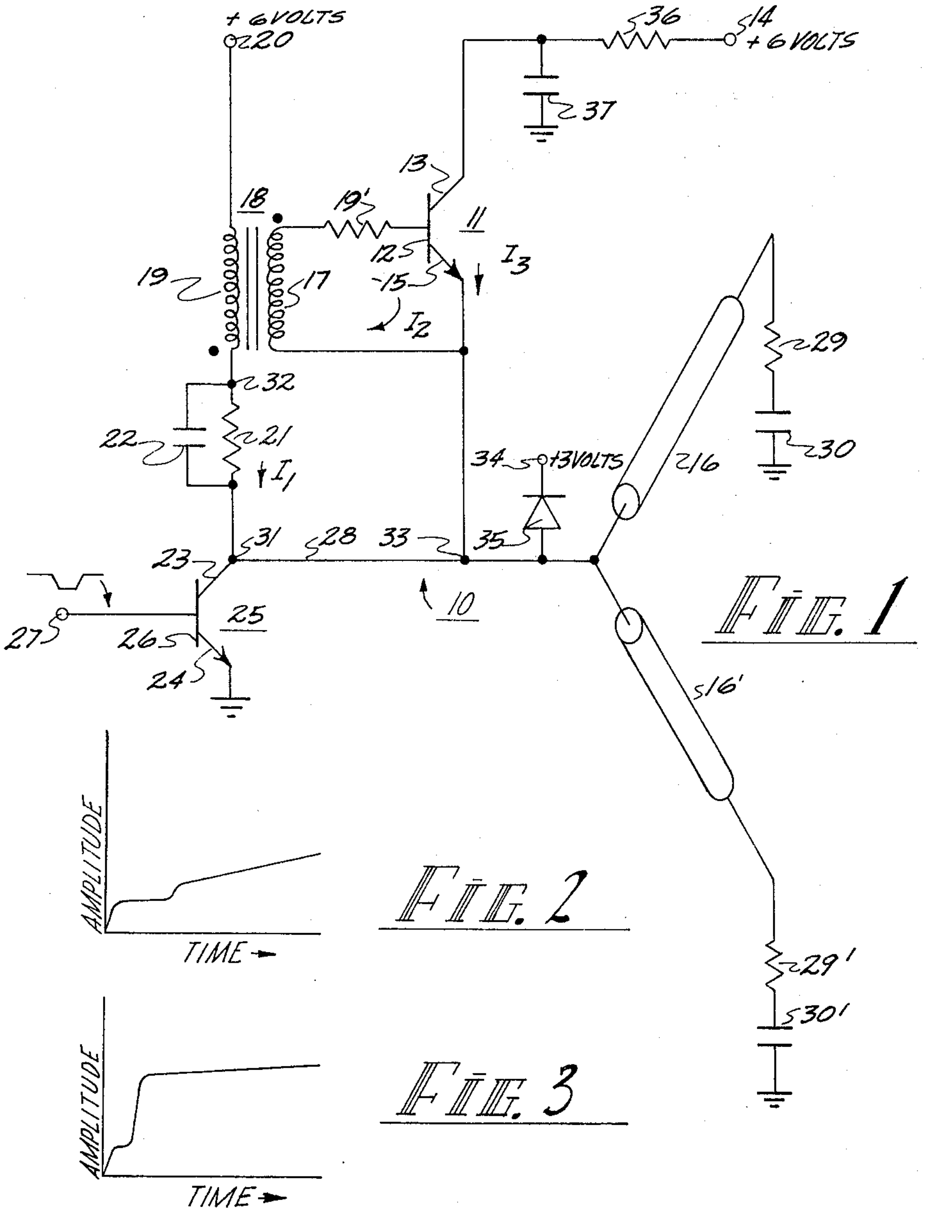
FIG. 1 is a schematic diagram of a transformer coupled amplifier employing regulating feedback in accordance with the invention.
FIG. 2 is a graphic representation of the voltage wave form at the load circuit when the driving current is small in one direction as provided directly from a signal source such as a flip-flop.
FIG. 3 is a graphic representation of the voltage wave form at the same load circuit referred to in FIG. 2 when the driving current is provided by the amplifier claimed.

Referring more particularly to the drawing by characters of reference, FIG. 1 discloses a regenerative transformer coupled amplifier 10 utilizing an NPN transistor 11 embodying the transformer feedback feature of the invention. As indicated in FIG. 1, transistor 11 comprises a current control electrode such as base electrode 12 and a pair of output electrodes such as collector electrode 13 and emitter electrode 15. Since transistor 11 is of the NPN type, the collector electrode 13 is coupled through a resistor 36 to terminal 14 which is connected to a suitable 6-volt positive potential source and the emitter electrode 15 is coupled to a load circuit such as, for example, coaxial cables 16, 16'.

An input signal is applied to base electrode 12 of transistor 11 by the secondary winding 17 of transformer 18. One terminal of winding 17 is connected to base electrode 12 through a resistor 19' while the other terminal of secondary winding 17 is connected to emitter electrode 15 of transistor 11. The primary winding 19 of transformer 18 is connected at one end thereof to terminal 20 which is connected to a +6 volt source and the other end of winding 19 is connected through an impedance means comprising a parallel arrangement of resistor 21 and capacitor 22, and the collector electrode 23 and emitter electrode 24 of an NPN transistor 25 to ground. The base electrode 26 of transistor 25 is connected to terminal 27 which is coupled to a suitable source of signal pulses such as, for example, a flip-flop circuit (not shown). Collector electrode 23 of transistor 25 is coupled through conductor 28 to the coaxial cables 16, 16', thereby providing a feedback connection between the emitter electrode or output terminal of amplifier 10 to the primary winding 19 of transformer 18. Dots are shown at the ends of windings 17 and 19 of transformer 18 to represent the phase of the voltage introduced in one winding with respect to the other winding. It will be noted that, if the voltage rises in the primary winding 19 of transformer 18 at the dot end thereof, the voltage in the transformer's secondary winding 17 will also rise at the dot end.

As shown in FIG. 1, the coaxial cables 16, 16' are arranged in series with resistor 29, 29' and capacitors 30, 30' connected between the ends of cables 16, 16' and ground. Resistors 29, 29' are so chosen that they substantially match the impedance value of the coaxial cables 16, 16'.

In the absence of a negative going pulse being applied to the base electrode 26 of transistor 25, the voltage at base electrode 26 will be positive with respect to its emitter electrode 24, thereby rendering transistor 25 conductive. Under these conditions current $I_1$ will flow from terminal 20 through the primary winding 19 of transformer 18, resistor 21, and collector and emitter electrodes 23 and 24 of transistor 25 to ground.

Upon the application of a negative signal pulse, as shown at terminal 27, to the base electrode of transistor 25, base electrode 26 will be rendered sufficiently negative with respect to its emitter electrode 24 to render transistor 25 non-conductive. Current $I_1$ will then flow through conductor 28, coaxial cables 16, 16', line matching impedance comprising resistors 29, 29' and capacitors 30, 30' to ground.

Due to the inductance of the primary winding 19 of transformer 18, current $I_1$ at this instance will be the same value as it was during the previous instant when it was flowing through transistor 25 to ground. This current flow through coaxial cables 16, 16' causes the voltage at node 33 to increase suddenly which in turn causes the voltage at nodes 31 and 32 to increase. This increase in voltage at the dot end of the primary winding 19 of transformer 18 will cause an increase in voltage at the dot end of the secondary winding 17 of transformer 18 thereby rendering base electrode 12 of transistor 11 sufficiently positive with respect to its emitter to render transistor 11 conductive. Rendering transistor 11 conductive causes a current $I_2$ to flow through the closed loop circuit comprising secondary winding 17 of transformer 18, resistor 19', base and emitter electrodes 12 and 15 of transistor 11, and a further current $I_3$ to flow from terminal 14 through resistor 36, the collector and emitter electrodes of transistor 11, coaxial cables 16, 16', line matching impedances comprising resistors 29, 29' and capacitors 30, 30' to ground. Resistor 36 limits the current flow from terminal 14 through transistor 11 while capacitor 37 provides a relatively large momentary current flow through transistor 11 at the instant that transistor 11 is rendered conductive.

This current flow $I_3$ further increases the potential at node 33 and in turn raises the potential at nodes 31 and 32. This further increase of potential at node 32 increases the potential at the dot end of secondary winding 17 thereby driving the base electrode 12 of transistor 11 more positive. This regenerative action continues until the voltage at node 33 reaches a given value which is determined by the voltage source coupled through terminal 34 and clamping diode 35 to node 33.

In order to maintain the regenerative action of the amplifier during the period of time that the potential at node 33 is building up to the clamp voltage of diode 35, part of current $I_3$ is arranged to flow from node 33 through conductor 28, node 31, capacitor 22, node 32, primary winding 19 of transformer 18 to terminal 20, thereby maintaining a positive potential at the dot end of primary winding 19.

When node 33 reaches substantially the potential value of the source connected to terminal 34, the potential at nodes 31 and 32 ceases to rise any further. Capacitor 22 which had been previously charged to 6 volts by current flow $I_1$ now has been partially discharged by that portion of current $I_3$ flowing through it to terminal 20. The high current sustained through primary winding 19 during the transition period now starts decaying at the end of same period. The current approximately follows an L/R exponential decay curve through the secondary winding 17 of transformer 18 until it is no longer large enough to keep the base electrode 12 of transistor 11 positive enough to keep transistor 11 conductive. Transistor 11 is then rendered non-conductive and currents $I_2$ and $I_3$ cease to flow.

Current from terminal 20 flowing through winding 19 of transformer 18, resistor 21, conductor 28, and diode 35 to terminal 34 keeps the voltage at node 33 and hence the coaxial cables approximately equal to the voltage at terminal 34 when transistor 25 is in its non-conductive state.

FIG. 2 is a graphic representation of a voltage wave form at node 33 when the driving current is provided by a unidirectionally weak signal source such as a flip-flop.

FIG. 3 is a graphic representation of the voltage wave form at node 33 when the driving current is provided by the subject invention. The amplifying means shown comprising transistor 11 provides sufficient current so that the voltage at node 33 rises much more rapidly than the voltage shown in the graphic representation shown in FIG. 2. In accordance with the invention claimed, the voltage at node 33 reaches substantially the clamp voltage of terminal 34 with very little reflected current due to the R-C termination of the coaxial cables by resistors 29, 29' and capacitors 30, 30'.

While the principles of the invention have now been made clear in an illustrative embodiment, there will be immediately obvious to those skilled in the art many modifications of structure, arrangement, proportions, the elements, materials, and components, used in the practice of the invention, and otherwise, which are particularly adapted for specific environments and operating requirements without departing from those principles. The appended claims are therefore intended to cover and embrace any such modifications, within the limits only of the true spirit and scope of the invention.

What is claimed is:

1. A regenerative amplifier effective in one voltage level changing direction only comprising a switching device having emitter, collector and base electrodes, an amplifier device having emitter, collector and base electrodes, a transformer having a primary winding and a secondary winding, first and second direct current reference potentials, said primary winding having a first end coupled to said emitter electrode of said amplifier device and to said collector electrode of said switching device and a second end coupled to said first reference potential, said emitter electrode of said switching device being connected to ground, said first reference potential causing current flow through said primary winding and said collector and emitter electrodes of said switching device, coupling means connecting a first end of said secondary winding to said base electrode of said amplifier device, said secondary winding having its second end connected to said emitter electrode of said amplifier device to provide a feedback voltage to said first end of said primary winding in phase with the change in voltage on said base electrode of said amplifier device to provide regeneration, said secondary winding causing regeneration to be effective during at least a part of one half of the voltage cycle, means connecting said collector electrode of said amplifier device to said second reference voltage, and means for applying an input signal to said base electrode of said switching device to interrupt current flow through said switching device to energize said regenerative amplifier.

2. A regenerative amplifier effective in one voltage level changing direction only comprising a switching device having emitter, collector and base electrodes, an amplifier device having emitter, collector and base electrodes, a transformer having a primary winding and a secondary winding, first and second direct current reference potentials, said primary winding having a first end coupled to said emitter electrode of said amplifier device and to said collector electrode of said switching device and a second end coupled to said first reference potential, said emitter electrode of said switching device being connected to ground, and first reference potential causing current conduction through said primary winding and said collector and emitter electrodes of said switching device, R-C impedance coupling means arranged between said first end of said primary winding and said collector electrode of said switching device, said impedance means limiting current flow through said switching device, coupling means connecting a first end of said secondary winding to said base electrode of said amplifier device, said secondary winding having its second end connected to said emitter electrode to provide a feedback voltage to said primary winding in phase with the change in voltage on said base electrode of said amplifier device to provide regeneration, means connecting said collector electrode of said amplifier device to said second reference voltage, and means for applying an input signal to said base electrode of said switching device to interrupt current flow through said switching device to energize said amplifier device.

References Cited by the Examiner

UNITED STATES PATENTS

| | | | |
|---|---|---|---|
| 2,243,533 | 5/1941 | McFarlane | 330—71 |
| 2,811,590 | 10/1957 | Doremus et al. | 330—18 |
| 2,835,750 | 5/1958 | Volkers et al. | 330—18 X |
| 3,210,689 | 10/1965 | Burwen | 330—18 X |

ROY LAKE, *Primary Examiner.*

N. KAUFMAN, *Assistant Examiner.*